US007944257B2

(12) United States Patent
Wu

(10) Patent No.: US 7,944,257 B2
(45) Date of Patent: *May 17, 2011

(54) METHOD AND SYSTEM OF OPTIMIZING A CONTROL SYSTEM USING LOW VOLTAGE AND HIGH-SPEED SWITCHING

(75) Inventor: I-chang (Bart) Wu, Fremont, CA (US)

(73) Assignee: Ralink Technology (Singapore) Corporation, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/465,808

(22) Filed: May 14, 2009

(65) Prior Publication Data

US 2010/0289539 A1 Nov. 18, 2010

(51) Int. Cl.
*H03L 7/06* (2006.01)
(52) U.S. Cl. ...................... 327/157; 327/148
(58) Field of Classification Search .................. 327/148, 327/149, 156–158
See application file for complete search history.

(56) References Cited

U.S. PATENT DOCUMENTS

| 6,292,061 | B1 * | 9/2001 | Qu ................................. 331/17 |
| 6,441,655 | B1 * | 8/2002 | Fallahi et al. ................. 327/115 |
| 7,005,896 | B2 * | 2/2006 | Chen et al. .................... 327/112 |
| 7,132,880 | B2 * | 11/2006 | Ingino, Jr. ..................... 327/541 |
| 7,705,641 | B2 * | 4/2010 | Wu et al. ....................... 327/157 |

* cited by examiner

*Primary Examiner* — Lincoln Donovan
*Assistant Examiner* — Adam D Houston
(74) *Attorney, Agent, or Firm* — Sawyer Law Group, P.C.

(57) ABSTRACT

A phase-locked loop charge pump driven by low voltage input is disclosed. In one aspect, a charge pump for a phase-locked loop circuit includes a sourcing current source providing a sourcing current, wherein the sourcing current source is coupled to a high-voltage operating voltage supply. A sourcing control circuit uses low-voltage sourcing control signals to selectively cause the charge pump to source the sourcing current to an output of the charge pump. A sinking control circuit uses low-voltage sinking control signals at a low voltage and utilizes a low-swing current mechanism to sink the sinking current from the output of the charge pump. In another aspect, the sourcing control circuit is cascode and the sinking circuit is non-cascode. In another aspect the sourcing current source and the sinking current source are both cascode. In another aspect, the sourcing current source is non-cascode and the sinking current source is cascode. In another aspect, the sourcing current source and the sinking current source are both non-cascode.

19 Claims, 13 Drawing Sheets

CHARGE-PUMP BLOCK DIAGRAM

CHARGE-PUMP BLOCK DIAGRAM

METHOD AND SYSTEM OF OPTIMIZING A CONTROL SYSTEM USING LOW VOLTAGE AND HIGH-SPEED SWITCHING

FIELD OF THE INVENTION

The present invention relates generally to phase-locked loop circuits and more specifically to high voltage phase-locked loop charge pump driven by low voltage input.

BACKGROUND OF THE INVENTION

Phase-locked loops (PLLs) are used extensively in electronic circuits to generate a signal that has a fixed relation to the phase of a reference signal. A PLL circuit raises or lowers the frequency of a controlled oscillator signal until it matches the reference signal in both frequency and phase. Phase-locked loops are widely used in electronic applications to, for example, generate stable frequencies, recover a signal from a noisy communication channel, or distribute clock timing pulses in digital logic designs.

In conventional PLL circuits, all PLL components operate at the same voltage supply level. Thus, an oscillator providing a reference signal, a phase frequency detector, a charge pump, low pass loop filter, voltage-controlled oscillator (VCO), and frequency divider all may operate at, for example, 3.3 volts. However, in a more recent deep sub-micron process, the operating voltages of all the digital blocks can be reduced, e.g. to around 1 volt, to save power while achieving higher speed. These digital blocks can include the frequency divider, prescaler, phase frequency detector, VCO, and reference signal oscillator. A higher voltage, however, is still desired as the operating voltage for the charge pump to minimize jitter, noise, leakage, and linearity distortion, and to achieve a high tuning range for the VCO.

To allow the charge pump to operate at a higher voltage level, an open drain circuit or a cross-coupled voltage level shifter is typically used to convert the low voltage control signals from the phase frequency detector to a higher voltage level that controls the charge pump. However, the low speed performance of voltage level shifters may cause large jitter and noise in the PLL circuit. Likewise, an open drain circuit is a significant contributor of jitter and noise in the PLL. Other designs compromise the optimization by requiring that all components of the PLL circuit function at the same voltage level, either at the higher voltage or at the lower voltage.

Accordingly, a system and method that operates a charge pump in a PLL circuit at higher voltage while operating other components of the PLL circuit at a lower voltage without significantly increasing jitter and noise in the PLL circuit, would be desirable in many applications.

SUMMARY OF THE INVENTION

The invention of the present application relates to a phase-locked loop charge-pump driven by low voltage input. In one aspect of the invention, a charge pump for a phase-locked loop circuit includes a sourcing current source providing a sourcing current, wherein the sourcing current source is coupled to a high-voltage operating voltage supply. A sourcing control circuit uses low-voltage sourcing control signals at a low voltage to selectively cause the charge pump to source the sourcing current to an output of the charge pump. A sinking control circuit uses low-voltage sinking control signals at a low voltage and utilizes a low-swing current mechanism to sink the sinking current from the output of the charge pump.

In another aspect of the invention, a phase frequency detector operates at a low voltage and provides low-voltage sourcing control signals and low-voltage sinking control signals at the low voltage. A charge pump operates at a high voltage and includes a sourcing control circuit coupled to the low-voltage sourcing control signals and selectively causing the charge pump to source the sourcing current to an output of the charge pump based on the low-voltage sourcing control signals. The charge pump also includes a sinking control circuit that receives the low-voltage sinking control signals and selectively causes the charge pump to sink the sinking current from the output of the charge pump based on the low-voltage sinking control signals.

In another aspect of the invention, a method for sourcing and sinking current using a charge pump in a phase-locked loop includes providing a sourcing current using a sourcing current source, where the sourcing current source is coupled to a high-voltage operating voltage supply of the charge pump. The charge pump is selectively caused to source the sourcing current to an output of the charge pump using a sourcing control circuit receiving low-voltage sourcing control signals. A sinking current is provided using sinking current source, wherein one of the sinking current transistors is coupled to ground. The charge pump is selectively caused to sink the sinking current from the output of the charge pump using a sinking control circuit coupled to the sinking switch, the sinking control circuit receiving low-voltage sinking control signals and utilizing a low-swing current mechanism to sink the sinking current from the output of the charge pump.

In another aspect of the invention, the sourcing current source is cascode and the sinking current source is non-cascode. In another aspect the sourcing current source and the sinking source are both cascode. In another aspect, the sourcing current source is non-cascode and the sinking current source is cascode. In another aspect, the sourcing current source and the sinking current source are both non-cascode.

The present invention provides a charge pump for a PLL circuit which can operate at a high voltage and receive low voltage control signals to control the charge pump output. The low voltage control signals need not be level shifted or otherwise increased to the operating voltage of the charge pump before being received at the charge pump, thus reducing jitter and noise in the PLL circuit while still allowing other components of the PLL circuit to operate at a low voltage.

BRIEF DESCRIPTION OF THE DRAWINGS

The various features of the present invention and manner of attaining them will be described in greater detail with reference to the following description, claims, and drawings, wherein reference numerals are reused, where appropriate, to indicate a correspondence between the referenced items, and wherein:

FIG. 3 is a schematic diagram illustrating a charge pump of the present invention in which sourcing and sinking currents are turned on;

FIG. 5 is a schematic diagram illustrating the charge pump of FIG. 3 in which only the sourcing current is turned on; and FIG. 6 is a schematic diagram illustrating the charge pump of FIG. 3 in which only the sinking current is turned on.

DETAILED DESCRIPTION

The present invention relates generally to control systems and more specifically to varying the voltage levels among the various electronic blocks within a control system. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

A method and system in accordance with the present invention provides a plurality of electronic blocks wherein a low-swing current mechanism and a differential current mechanism are utilized to provide two different levels of voltage (one high and one low) to the electronic blocks. The method and system in accordance with the present invention has many advantages which are described hereinbelow.

Figure 1A:
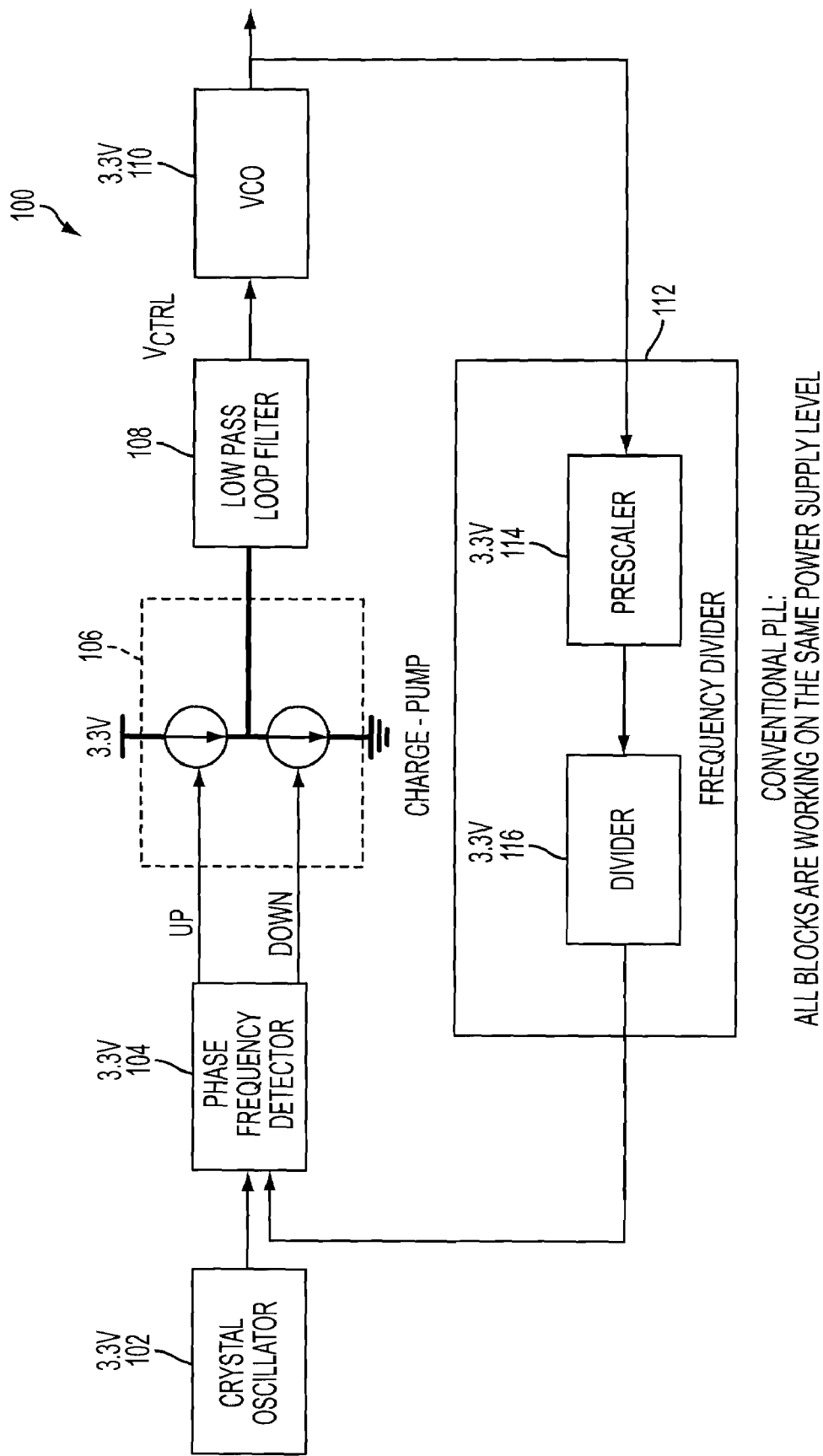
FIG. 1A is a block diagram of a conventional phase-locked loop (PLL), where each block is operating at the same power supply level.

FIG. 1A is a block diagram of a conventional PLL circuit 100 design, where each block is operating at the same power supply level. PLL circuit 100 includes a crystal oscillator 102 as a reference signal, a phase frequency detector 104, a charge pump 106, a low pass loop filter 108, a voltage-controlled oscillator (VCO) 110, and a frequency divider 112. Generally, VCO 110 generates a periodic output signal. The phase frequency detector 104 receives the reference signal from oscillator 102 and the output from the VCO 110 as a feedback signal, and compares the two signals to provide up (source) and down (sink) signals to the charge pump 106 in proportion to the phase error detected between the two signals. The charge pump is used to create a higher or lower voltage signals for the VCO. The charge pump 106 supplies charge amounts in proportion to the received signals to the low pass loop filter 108, and the filter smoothes out abrupt changes in the control voltage and provides the control voltage to the VCO 110. The VCO 110 provides the output to the circuit and the feedback signal to the frequency divider 112, which provides the divided signal back to the phase frequency detector 104. The frequency divider includes a prescaler 114 and a divider 116 and causes the PLL's output signal frequency to be an integer multiple of the reference signal. Thus, the phase frequency detector 104 matches the VCO output to the phase of the reference signal from crystal oscillator 102 and provides output signals that control the VCO such that the phase difference between the two inputs to the detector 104 is held constant.

Figure 1B:
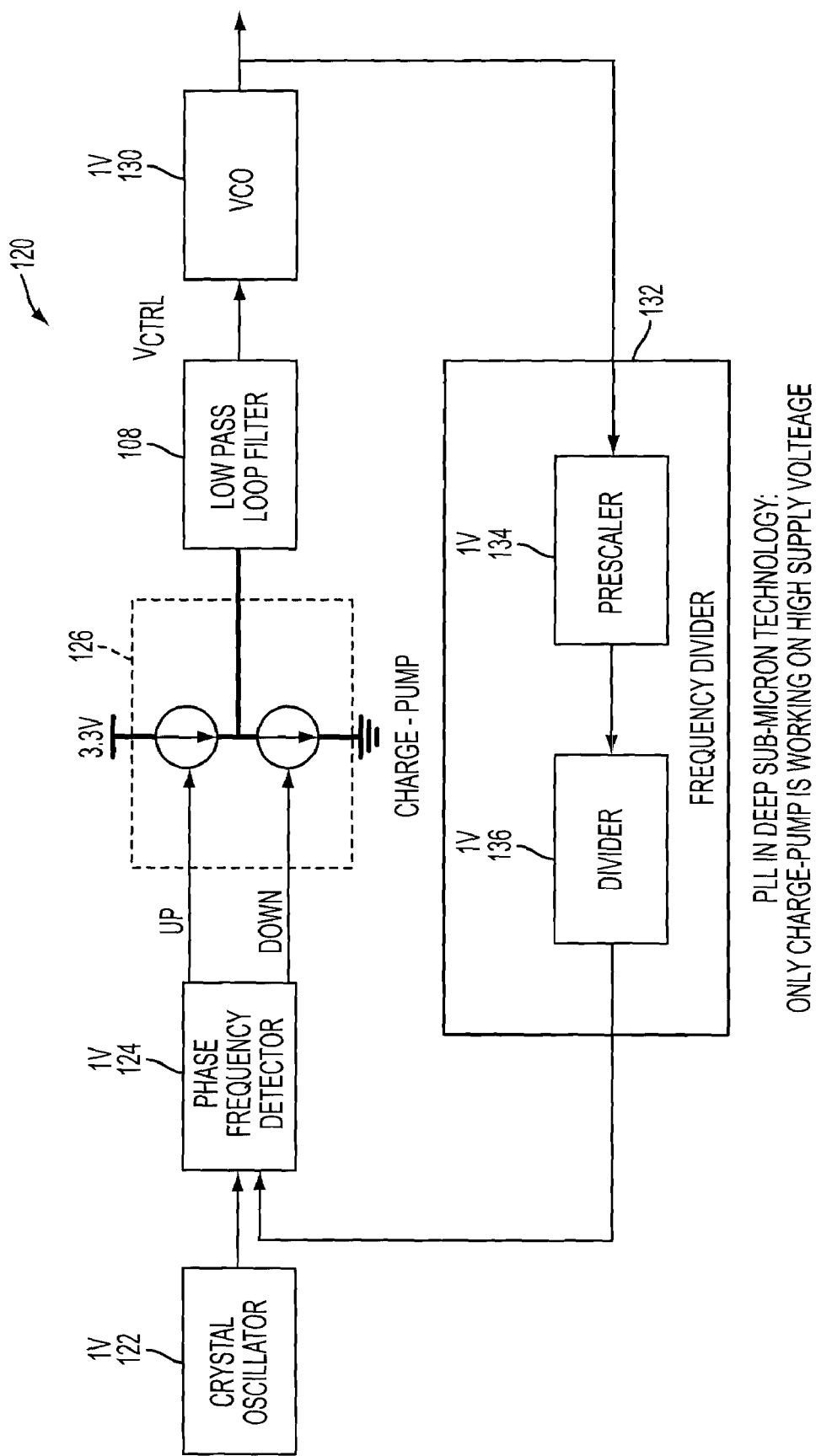
FIG. 1B is a block diagram of a phase-locked loop (PLL) circuit suitable for use with the present invention.

In a previous design, all PLL blocks operate at the same voltage supply level, for example 3.3 volts. In more recent deep sub-micron processes, as illustrated in FIG. 1B, the operating voltages of the digital blocks can be reduced to save power while achieving higher speed, e.g. to around 1 volt, including the frequency divider 132, prescaler 134, divider 136, phase frequency detector 124, VCO 130, and crystal oscillator 122. A higher voltage is still used as the operating voltage for the charge pump 126 to minimize jitter, noise, leakage, and linearity distortion, and to achieve a high tuning range for the VCO.

Figure 2:
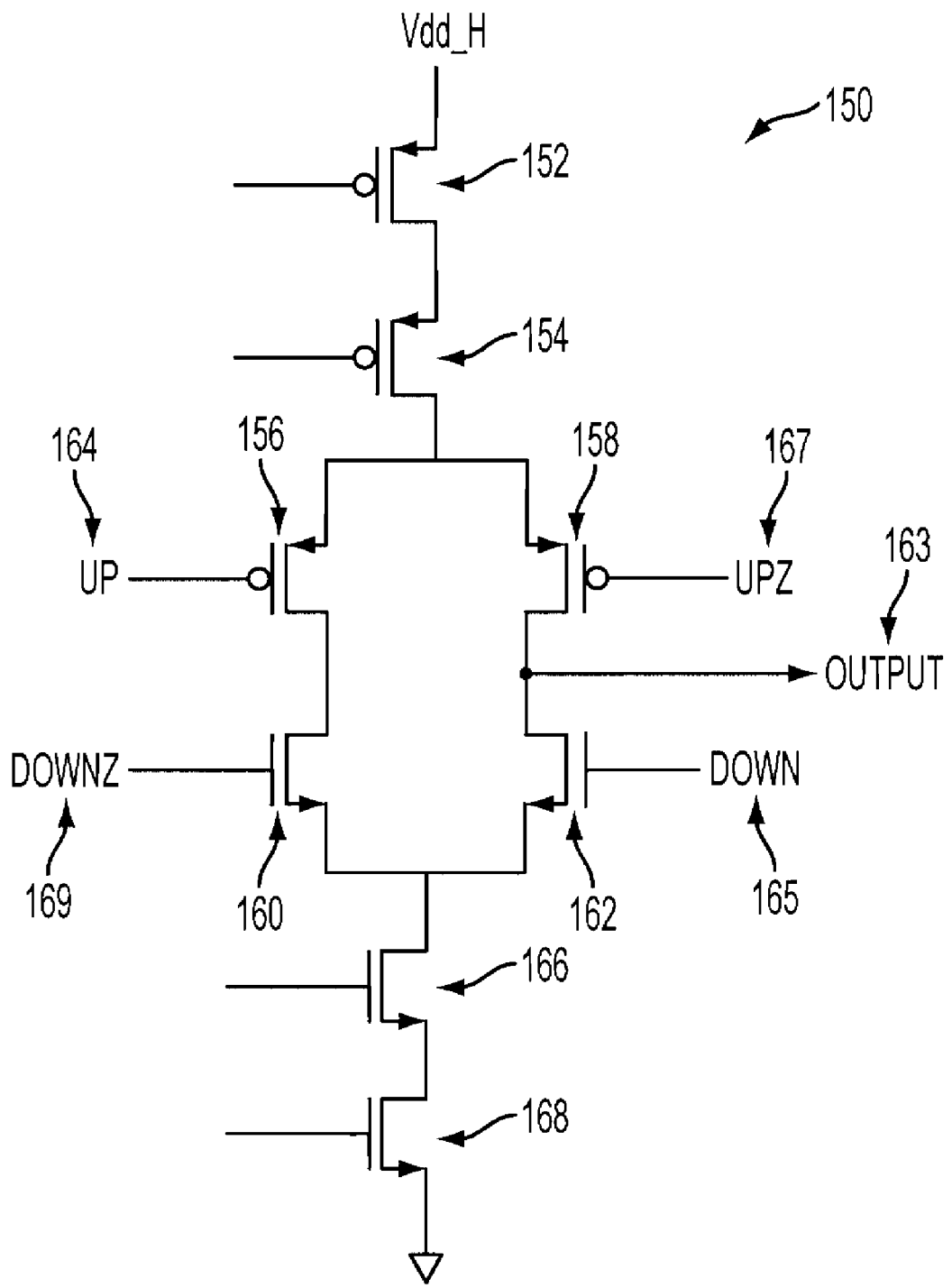
FIG. 2 is a schematic diagram illustrating a previous charge pump of a PLL circuit.

FIG. 2 is a schematic diagram of a previous charge pump 150 in which the control signals from the phase frequency detector at a higher voltage level. Charge pump 150 includes PMOS transistors 152, 154, 156, and 158, which provide a sourcing function, and NMOS transistors 168, 166, 160, and 162, which provide a sinking function. Transistor 152 is a sourcing transistor that provides the sourcing current, and optional transistor 154 is a cascode device, which can increase the impedance of the current source. Transistor 152 is coupled at its source to an operating voltage of the charge pump, the high voltage Vdd_H, and transistor 154 is coupled at its drain to the sources of PMOS control transistors 156 and 158. NMOS control transistors 160 and 162 are coupled to the PMOS transistors 156 and 158, respectively. NMOS transistor 168 and optional NMOS cascode transistor 166 are coupled between the NMOS control transistors 160 and 162 and ground.

Transistors 156 and 158 form a differential switch. Control signals UP 164 and UPZ 167 are provided to the PMOS control transistors 156 and 158 and are complementary, able to steer current to either side. When UP equals "High", transistor 156 is off, and UPZ equals 0, turning on PMOS transistor 158, the current from sourcing current source 152 and cascode device 154 is steered to the output 163, such that the charge-pump sourcing function is turned on. When UP equals 0, transistor 156 is on, and UPZ equals "High", turning off PMOS transistor 158, the current from sourcing current source 152 and cascode device 154 is steered away from the output 163, such that the charge-pump sourcing function is turned off. Control signals DOWN 165 and DOWNZ 169 are provided to the NMOS control transistors 160 and 162. When DOWN equals "High", transistor 162 is on, and DOWNZ equals 0, turning off NMOS 160, the sinking current from the output 163 is steered through the NMOS 162 switch to cascode device 166 and sinking current source 168, such that the charge-pump sinking function is turned on. When DOWN equals 0, transistor 162 is off, and DOWNZ equals "High", turning on transistor 160, there is no sinking current through transistor 168, such that the charge-pump sourcing sinking is turned off.

Figure 3:
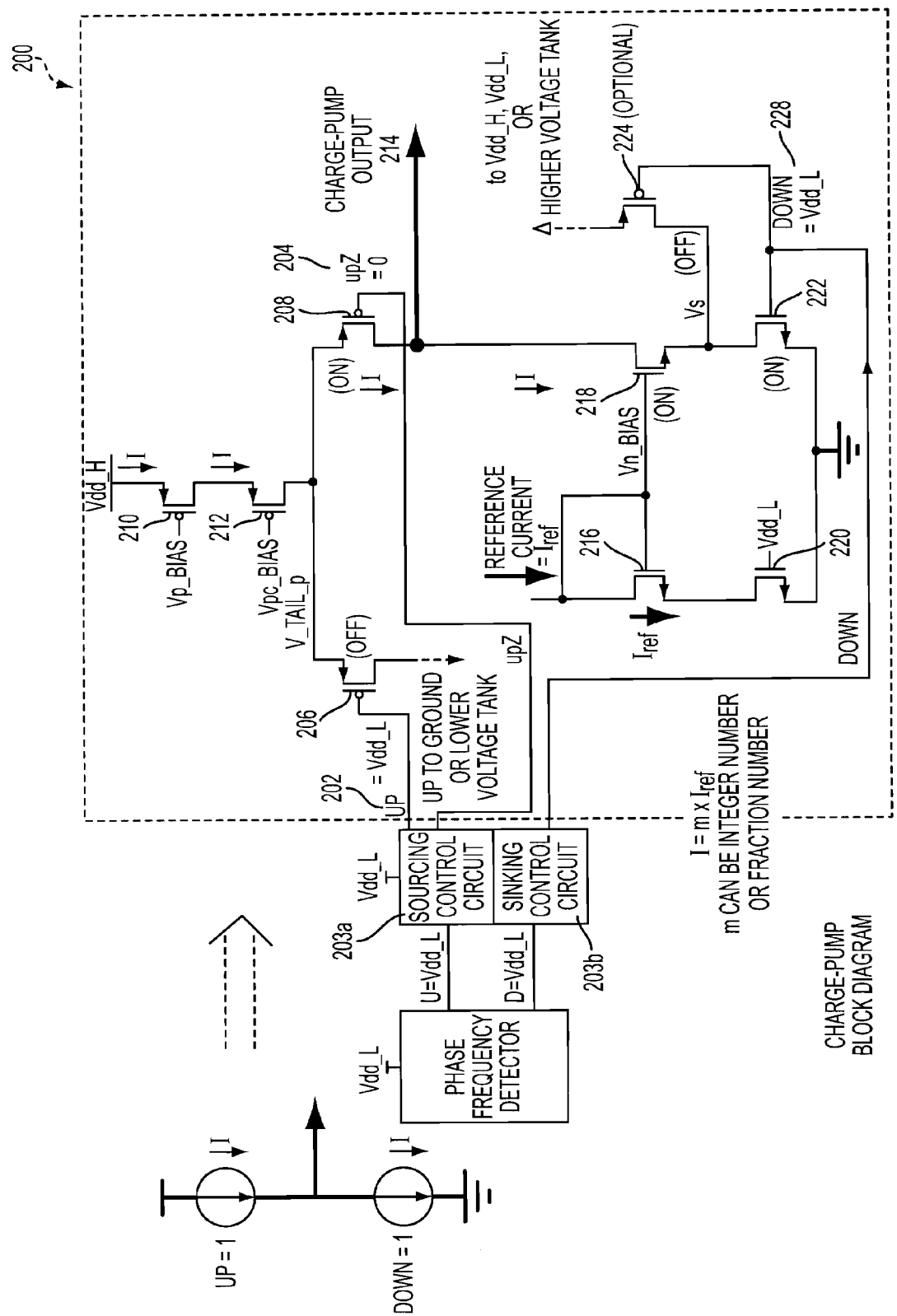

FIG. 3 is a schematic diagram illustrating a charge pump 200 of the present invention, which can receive lower voltage control signals directly from a phase frequency detector 104 without requiring a level shifter, open drain circuit, or other circuit to increase the control signal voltage to the higher operating voltage of the charge pump.

PMOS sourcing current is provided by sourcing current transistor 210, where transistor 210 is coupled at its source to an operating voltage of the charge pump, the high voltage Vdd_H. In one example, the high voltage Vdd_H is about 3.3V, but can be any suitable operating voltage for a charge pump. A bias voltage Vp_bias is provided at the gate of transistor 210 and Vpc_bias provided at the gate of transistor 212. All the bias voltages shown herein can be generated by a well-known current mirror structure (described below) or other source. The bias voltages depend upon the current, silicon process, voltage, and temperature of the circuit, e.g., a current mirror structure can automatically adjust the bias voltages to make the current sources the same as a reference current (not shown).

Control signals UP 202 and UPZ 204 are low voltage supply (Vdd_L) signals as provided by the phase frequency detector 104 sourcing control circuit 203a, where UPZ is the inverse of UP. Vdd_L is the lower voltage (below Vdd_H) at which other components of the PLL circuit are operating, such as the phase frequency detector 104. For example, if Vdd_H for the charge pump is approximately 3.3 volts, the low operating voltage Vdd_L of the phase detector 104 can be 1 volt, or some other voltage lower than 3.3 volts. The UP signals 202 and 204 are input to the gates of control transistors 206 and 208, respectively, which are coupled at their sources to the drain of transistor 212. Transistor 206 is coupled to ground at its drain, and transistor 208 is coupled at its drain to the output 214 of the charge pump and to the drain of NMOS transistor 218. Transistor 218 is coupled at its source to the drain of an NMOS transistor 222, which is coupled to ground at its source. Bias voltage Vn_bias is provided to the gate of the transistors 218. An optional PMOS transistor 224 can be coupled at its drain to the source of NMOS transistor 218, and can bring the source of NMOS 218 to a certain higher direct current (DC) voltage, which can be Vdd_H, Vdd_L, or a low impedance voltage tank. If employed, PMOS transistor 224 would prevent a floating condition and current leakage.

Transistors 206 and 208 is a differential switch that steers the direction of the PMOS sourcing current from transistors 210 and 212 based on the control signals UP 202 and 204. One example is shown in FIG. 3, where the control signal UPZ 204 is equal to 0 and the other control signal UP 202 is equal to Vdd_L. In this case, transistor 206 is turned off, and transistor 208 is turned on, and the current from sourcing current source 210 and transistor 212 is steered to the output 214, such that the charge pump sourcing function is turned on. The sourcing current I is delivered to the loop filter 108 via output 214 through PMOS transistor 208. Because the sourcing control transistors 206 and 208 are p-channel, the lower voltage from the phase frequency detector 104 to be used to control these transistors.

The lower voltage signals cannot directly control the NMOS differential switch composed of transistors 160 and 162 because the low voltage signals do not have enough big swing to steer the NMOS differential switch. Therefore, another current topology is employed in the sinking operation. The NMOS sinking current flows from transistors 218 and 222. The ratio of the current flowing through 218 over that in 216 is similar to their size ratio. Therefore, 216 and 218 form a current mirror. NMOS transistor 222 is a switch, which is coupled to ground at its source. Vn_bias is provided to the gate of transistor 218. Transistor 220 is a matching device, which provides similar impedance to that of transistor 222. When control signal DOWN 228 is equal to Vdd_L, the sinking current is drawn out through NMOS 218 and 222 from the loop filter to ground and is equal to or multiple of the current of NMOS 216 and 220.

Control signal DOWN 228 is provided directly as lower voltage (Vdd_L) supply signals from the phase frequency detector 104 via the sinking control circuit 203b. The DOWN signal 228 is input to the gate of NMOS sinking control transistor 222, which is coupled at its drain to the source of transistor 218 and makes up a sinking control circuit. Transistor 222 is coupled at its drain to the source of NMOS transistor 218, and transistor 222 is coupled at its source to ground.

Thus there are two sides of the charge pump circuit, where one side provides the sourcing function and includes transistors 210, 212, 206, and 208, and the other side provides the sinking function and includes transistors 218, 216, 222 and 220. The transistors 206 and 208 form a differential current switch using the complimentary UP and UPZ signals which steer the current flow to either side. Transistors 218, 216, 222 and 220 provide the sinking function, which is a mirror design (216 mirrors the current of 218 while 220 and 222 are degenerative switches).

Because the sinking control transistor N-channel 222 is a degenerative switch, signals of the lower voltage Vdd_L from the phase frequency detector 104 can be used to control this transistor. This is unlike the previous charge pumps that require high-voltage (Vdd_H) control signals to steer the differential switches so as to control the sinking current.

Figure 12:
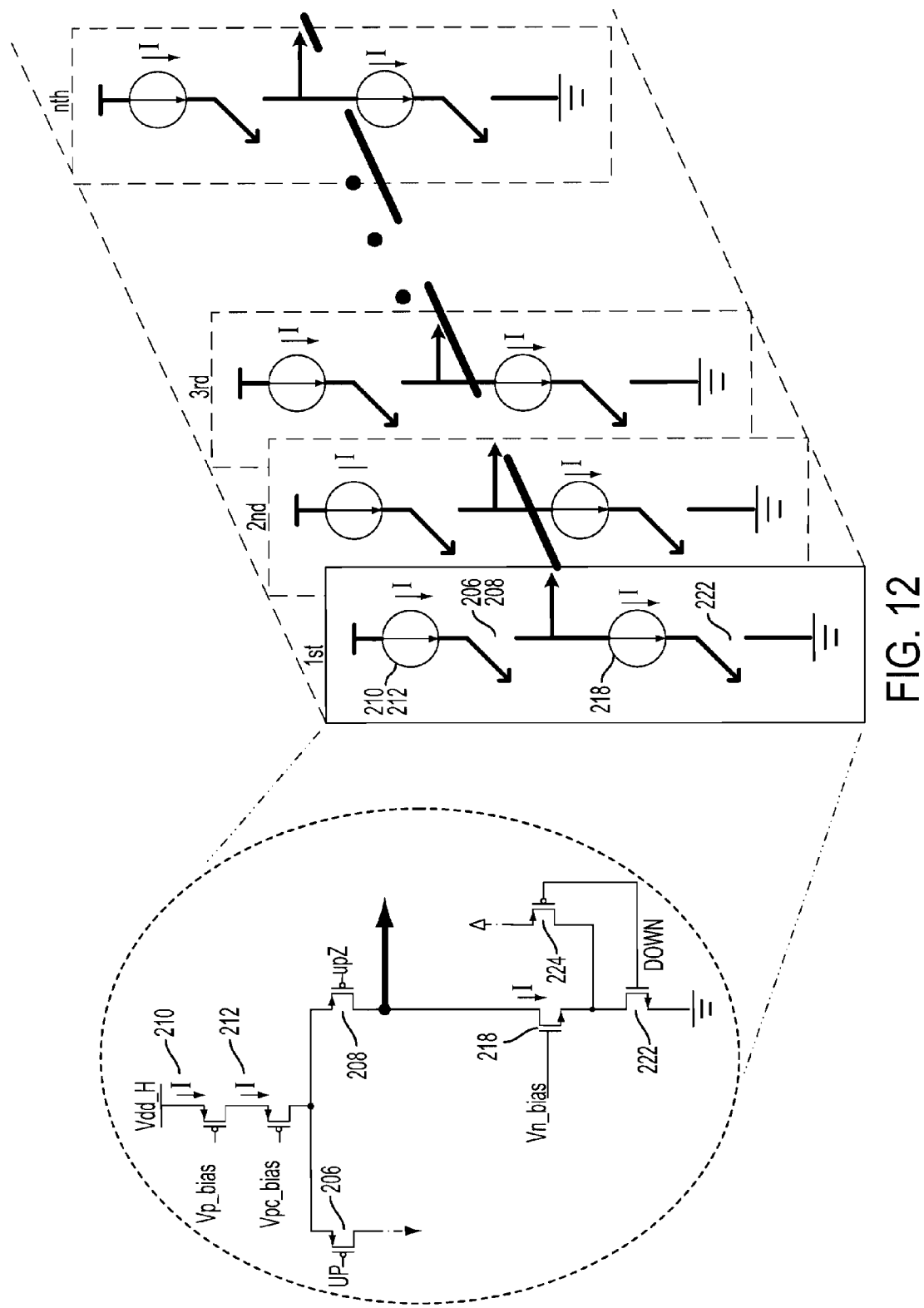
FIG. 12 is a schematic diagram illustrating multiple sourcing and sinking circuit sets to provide the desired performance of the charge pump.

In an embodiment, transistors 210, 212, 206, and 208 form a sourcing circuit set and transistors 218, 222, and optional transistor 224 form a sinking circuit set. Therefore, there may be multiples of sourcing and sinking circuit sets as shown in FIG. 12 to provide the desired performance of the charge pump. Furthermore, this performance can be tuned through adjustment of the reference current, Iref or by turning on all or a portion of the above-mentioned sourcing circuit sets and sinking circuit sets. Accordingly, one of ordinary skill in the art may readily recognize the loop performance of the charge pump can be adjusted in a variety of ways, and those adjustments would be within the spirit and scope of the present invention.

Figure 4:
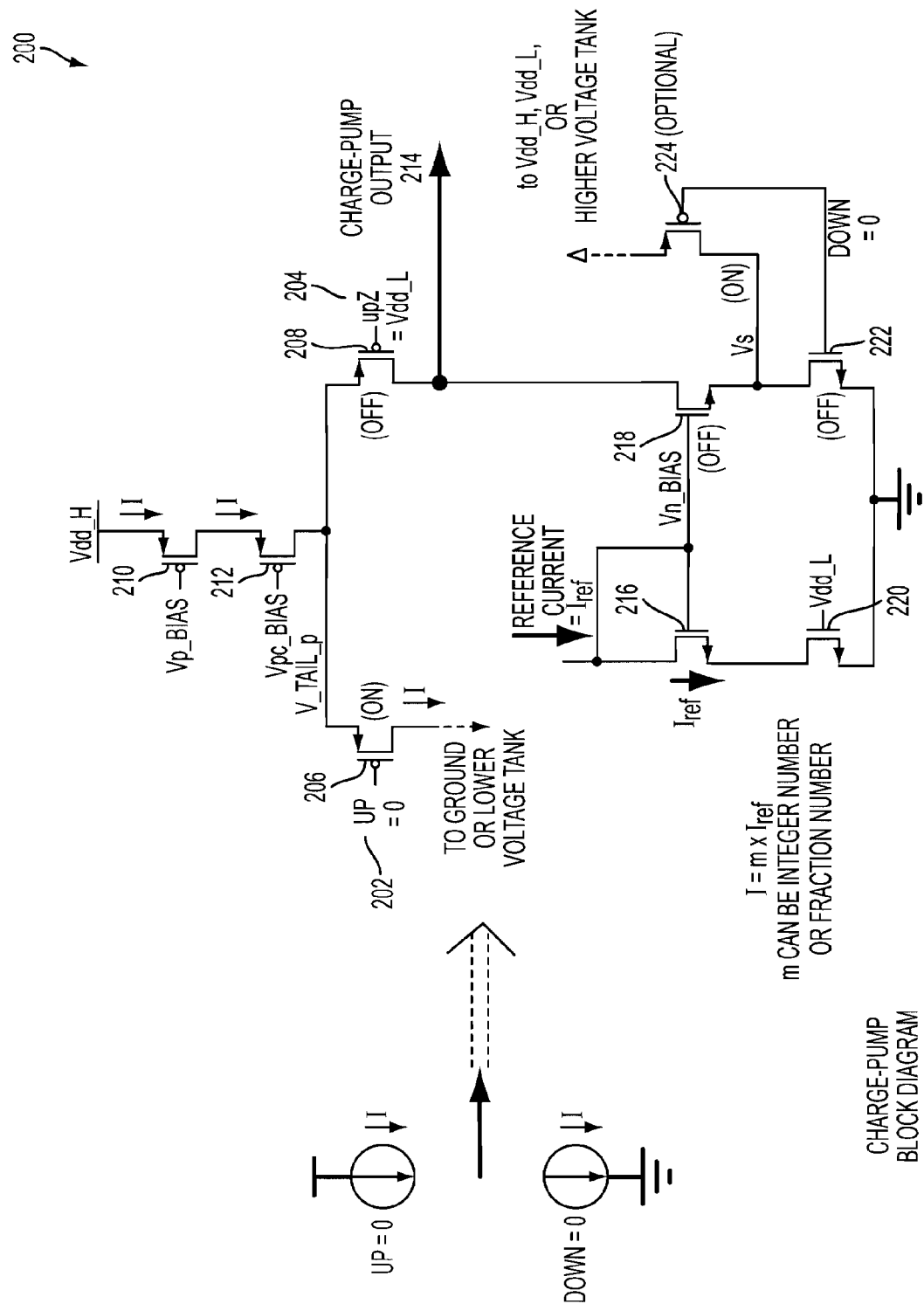
FIG. 4 is a schematic diagram illustrating the charge pump of FIG. 3 in which sourcing and sinking currents are turned off.

FIG. 4 is a schematic diagram illustrating the charge pump circuit 200 of the present invention in a condition such that both sourcing and sinking currents are turned off. When the control signal UPZ 204 is equal to Vdd_L while the other control signal UP 202 is equal to 0. This causes transistor 206 to be turned on and transistor 208 to be turned off, causing the current from source transistor 210 and device 212 to be directed to ground or a lower voltage tank through PMOS transistor 206. Thus, the charge pump sourcing function is turned off and there is no sourcing current delivered from the output 214 to the loop filter 108.

When the control signal DOWN 228 is equal to 0, NMOS 222 is powered off, and there is no current sunk from the loop filter. PMOS 224 is an optional switch, which, if engaged can bring the source of NMOS 218 to a certain higher DC voltage, which can be vdd_H, vdd_L, or a low impedance voltage tank, in order to prevent the floating condition and any possible current leakage.

Figure 5:
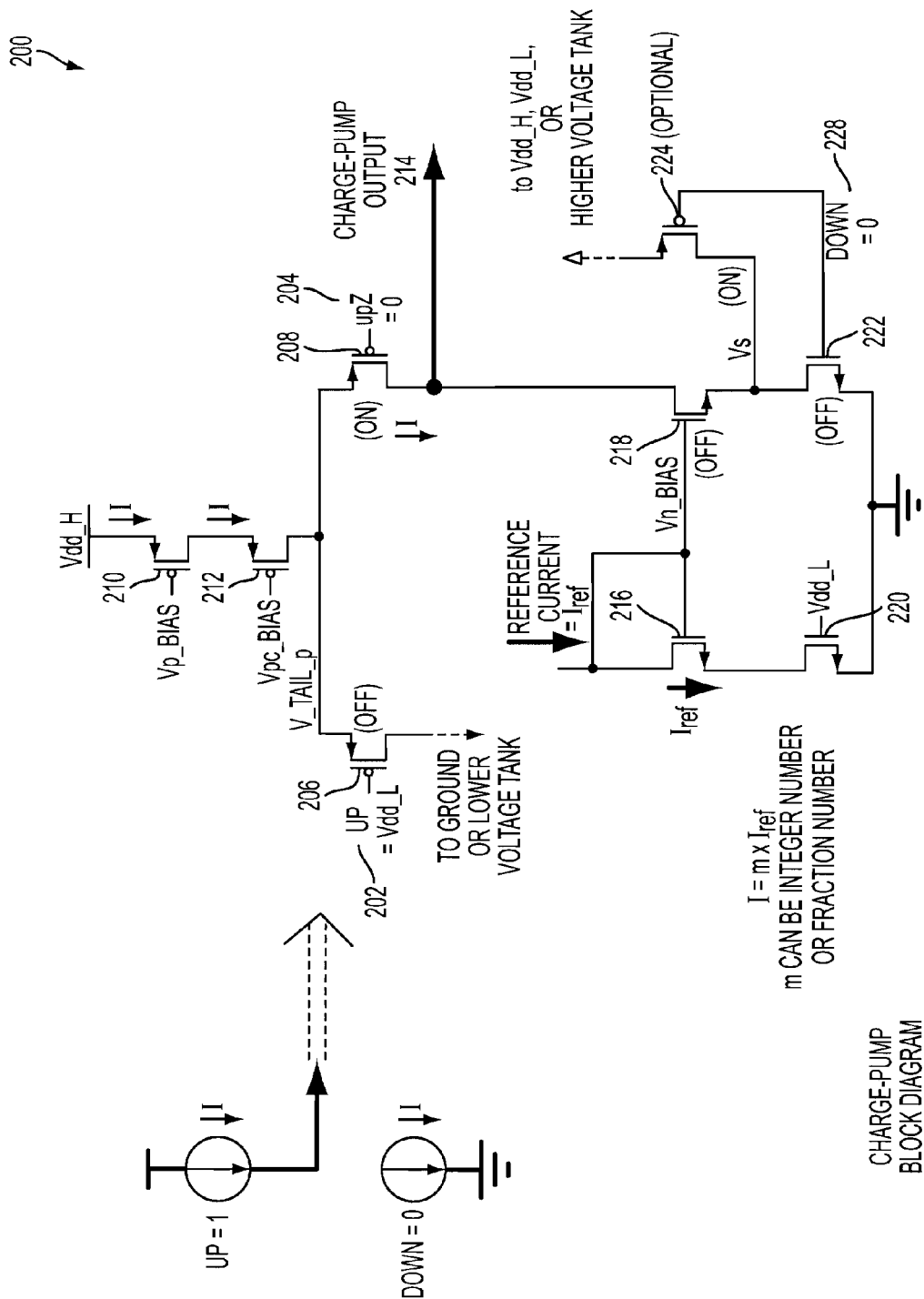

FIG. 5 is a schematic diagram illustrating the charge pump circuit 200 of the present invention in a condition such that only the sourcing current is turned on. The control signal UPZ 204 is equal to 0 while the other control signal UP 202 is equal to Vdd_L, causing the sourcing current in transistors 210 and 212 to be directed to the output 214 and the loop filter via the transistor 208, thus causing the current sourcing function to be on. The control signal DOWN 228 is equal to 0, NMOS 222 is powered off, and there is no current sunk from the loop filter. Thus, the current sunk from the loop filter 108 through the output 214 is 0, and the current sinking function is off.

Figure 6:
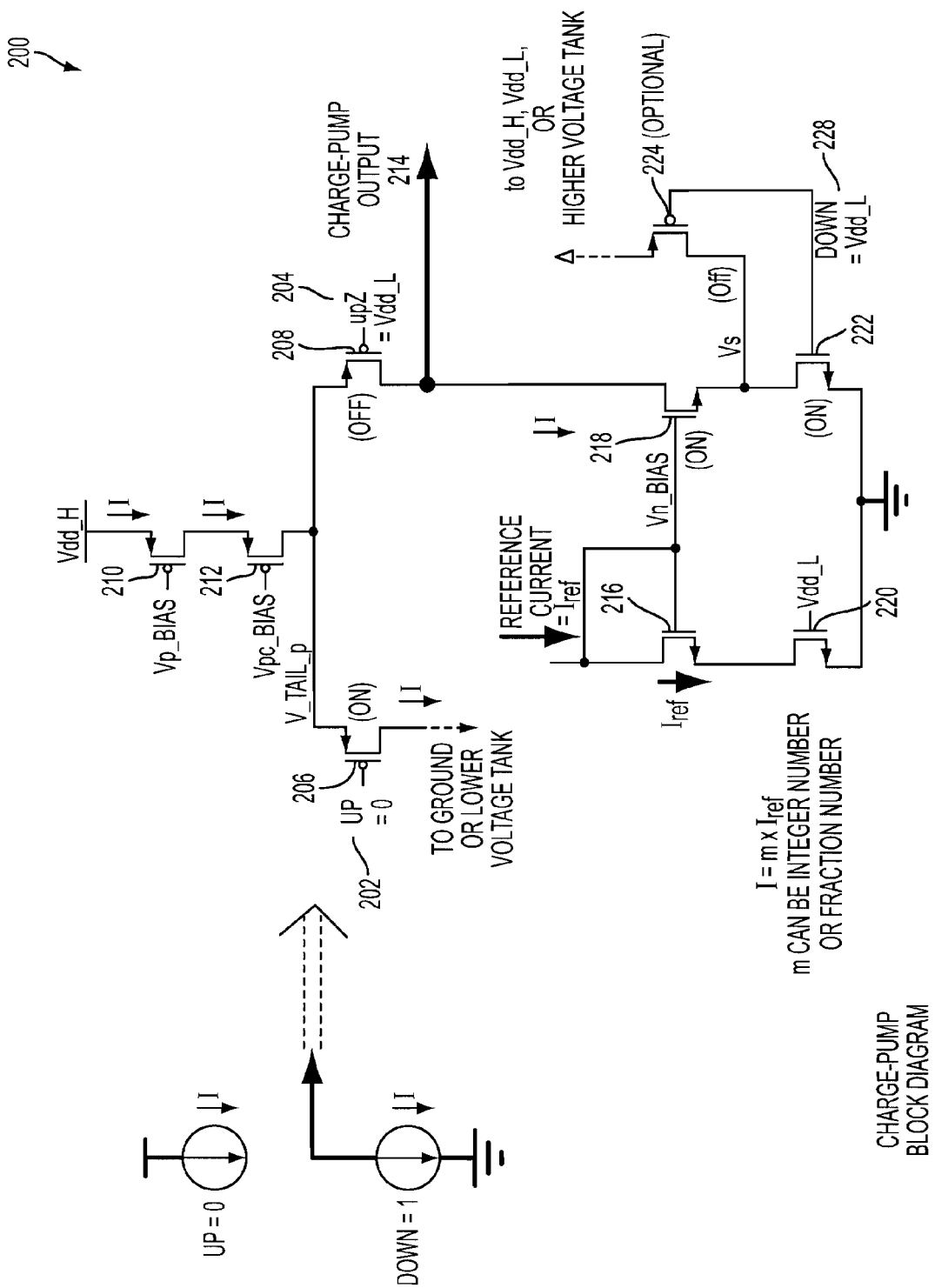

FIG. 6 is a schematic diagram illustrating the charge pump circuit 200 of the present invention in a condition such that only the sinking current is turned on. The operation is similar to that mentioned above in FIGS. 3 and 4 where appropriate. The control signal UPZ 204 is equal to Vdd_L while the other control signal UP 202 is equal to 0, causing the sourcing current in transistors 210 and 212 to be directed to ground via the transistor 206, such that no current is sourced to the output and the current sourcing function is off. The control signal DOWN 228 is equal to Vdd_L turning on switch device 222 while turning off the optional leakage-preventing device 224, and thus allowing the current sinking function to be on, where current is sunk from the loop filter through the charge-pump output 214 by NMOS transistor 218 to transistor 222 and ground.

Figure 7:
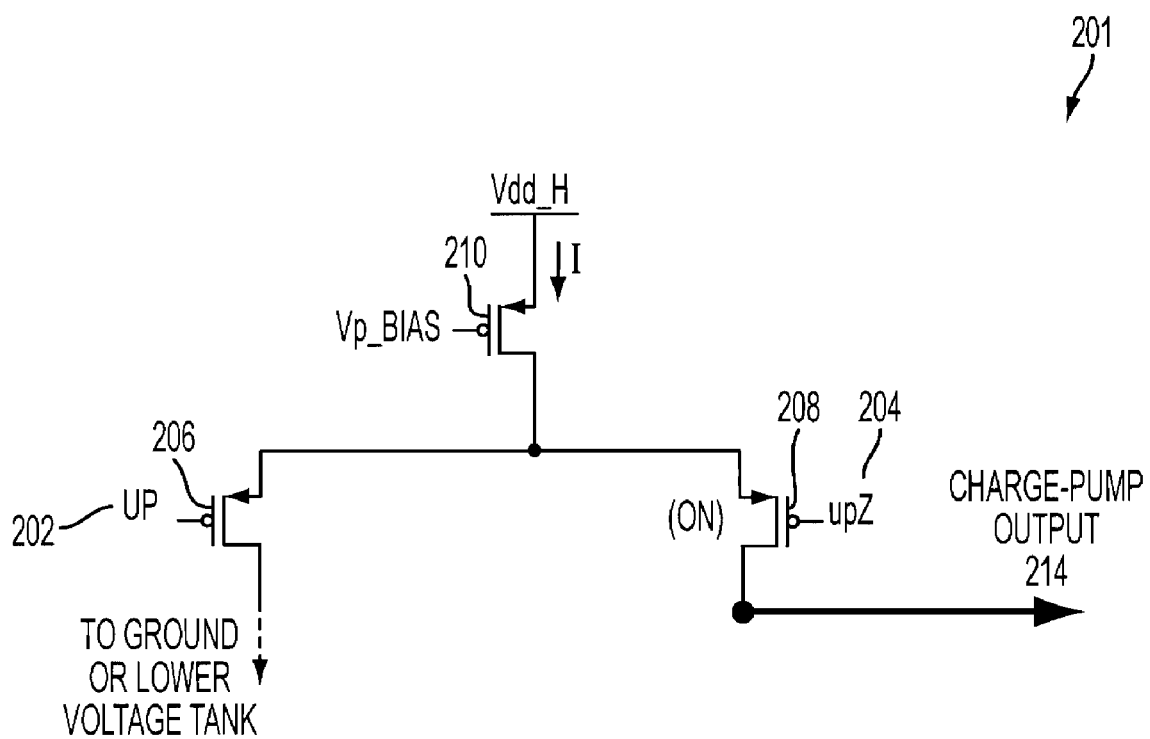
FIG. 7 is a schematic diagram illustrating the alternative design of the sourcing current source which is non-cascode.

FIG. 7 shows an alternative design 201 of the PMOS sourcing circuit 210, which is non-cascode. The operation is similar to that mentioned above in FIG. 3 to FIG. 6 where appropriate. If the control signal "UPZ" 204 is equal to 0 while the other control signal "UP" 202 is equal to Vdd_L, causing the sourcing current in transistor 210 to be directed to the output 214 and the loop filter via the transistor 208, thus causing the current sourcing function to be on. If the control signal "UPZ" 204 is equal to Vdd_L while the other control signal "UP" 202 is equal to 0, causing the sourcing current in transistor 210 to be directed to ground via the transistor 206, such that no current is sourced to the output and the current sourcing function is off. In FIG. 3 to FIG. 6, the devices 206, 208, 210, and 212 form a cascoded sourcing circuit, which can be replaced by that circuit shown in FIG. 7.

Figure 8:
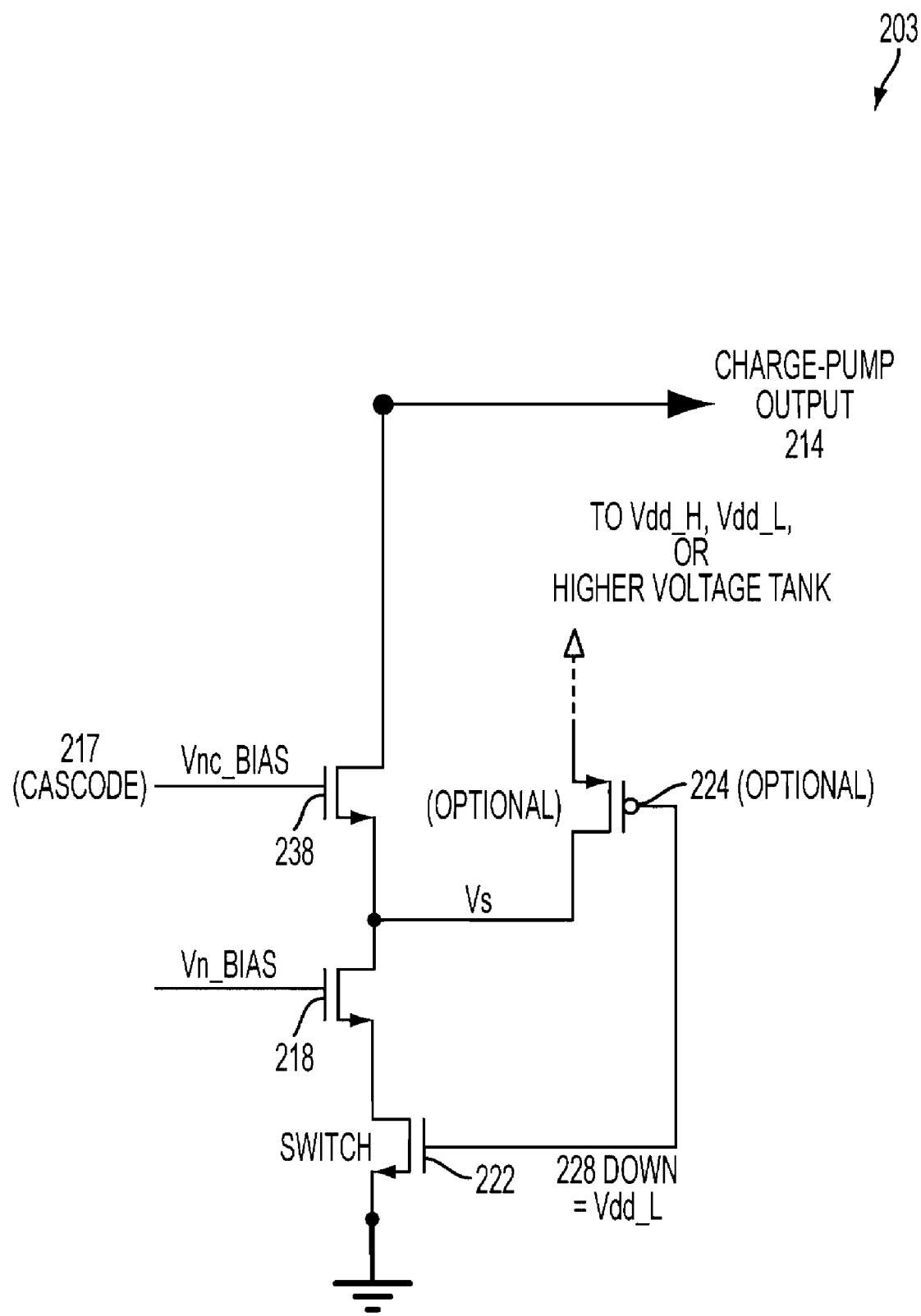
FIG. 8 is a schematic diagram illustrating the alternative design of the sinking current source which is cascode.

FIG. 8 shows an alternative design 203 of the NMOS sinking circuit 218, which is cascode. The operation is similar to that mentioned above in FIG. 3 to FIG. 6 where appropriate. NMOS sinking circuit 218 has a cascode device 238. PMOS 224 is an optional transistor, which, if engaged can bring the source of NMOS 238 to a certain higher DC voltage which can be vdd_H, vdd_L, or a low impedance voltage tank, in order to prevent the floating condition and any possible current leakage. The DOWN signal 228 is input to the gate of NMOS sinking control transistor 222, which is coupled at its drain to the source of transistor 218 and makes up a sinking control circuit. Transistor 222 is coupled at its drain to the source of NMOS transistor 218, and transistor 222 is coupled at its source to ground. If the control signal "DOWN" 228 is equal to Vdd_L, causing the sinking current flows from the output 214 and the loop filter via the transistors 238, 218, and 222 to ground, thus causing the current sinking function to be on. If the control signal "DOWN" 228 is equal to 0, the transistor 222 is off, which blocks the current path between output 214 and ground, such that no current is sunk to the ground and the current sourcing function is off. The optional PMOS transistor 224 can be turned on when the control signal "DOWN" 228 is equal to 0, and the source of the device 238 is pulled to a higher voltage to prevent the current leakage. In FIG. 3 to FIG. 6, the devices 218, 222, and 224 are sinking circuit without cascode device, which can be replaced by the cascode design shown in FIG. 8.

The invention allows PLL-based circuits, such as circuits providing a Frequency Synthesizer, Clock and Data Recovery functions, and/or Clock Generator to use different levels of supply or operating voltages between internal components, such as prescaler 134, frequency divider 136, phase frequency detector 124, and charge-pump 126, and reduce the jitter and noise between components having different operating voltages. The design is optimized to achieve low power, small size, low jitter, fast response, good linearity, and low phase noise.

The invention improves a PLL circuit by reducing the size, power, jitter, and phase noise of the circuit, while improving the linearity and speeds-up the response time. The invention provides a high performance and low cost PLL, Frequency Synthesizer, and Clock and Data Recovery. Advantages include smaller size, lower power, lower jitter, lower phase noise, better linearity, and faster response time.

Figure 9:
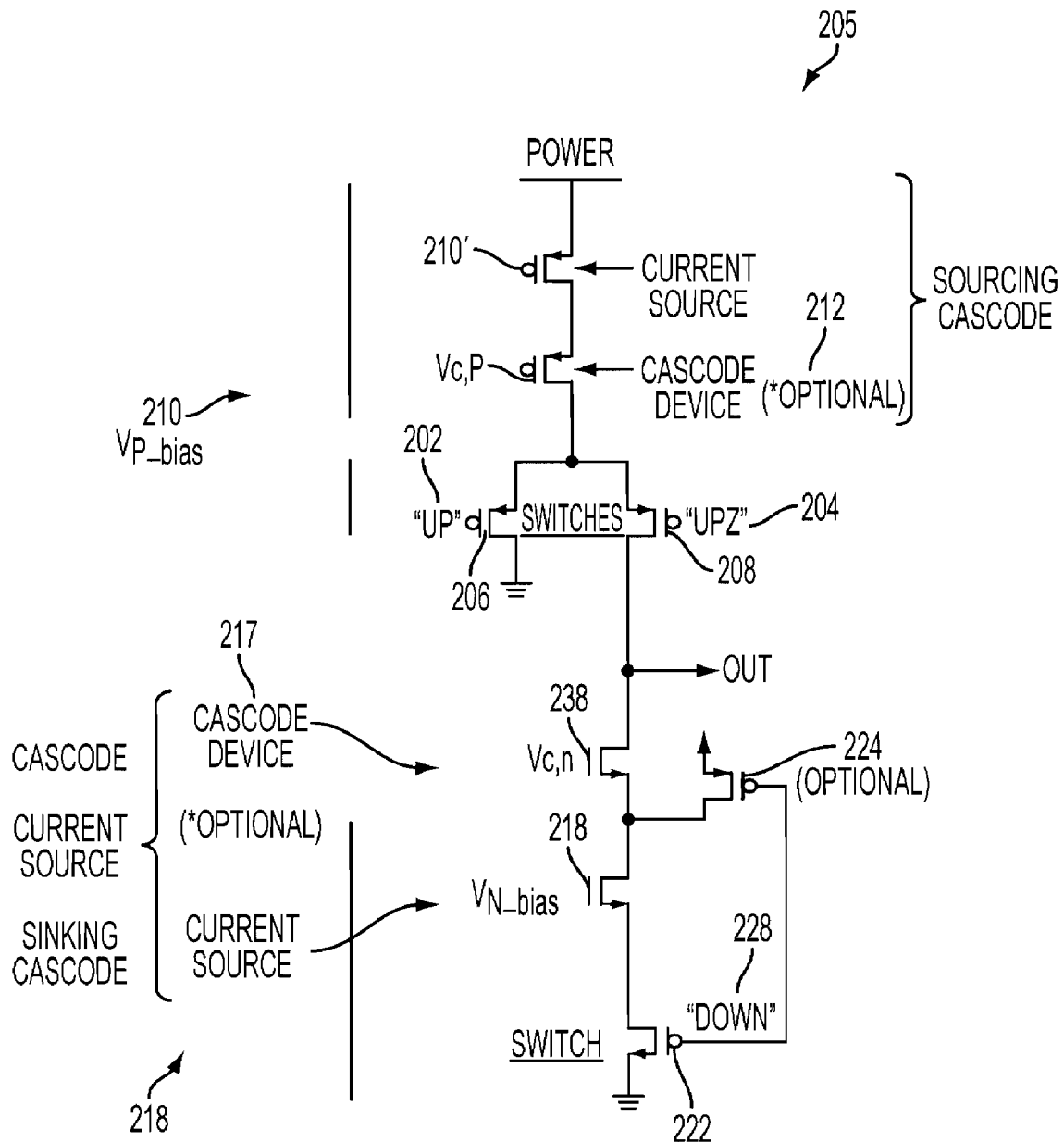
FIG. 9 is a schematic diagram illustrating the alternative design of the sourcing current source which is cascode and the sinking circuit which is cascode.
Figure 10:
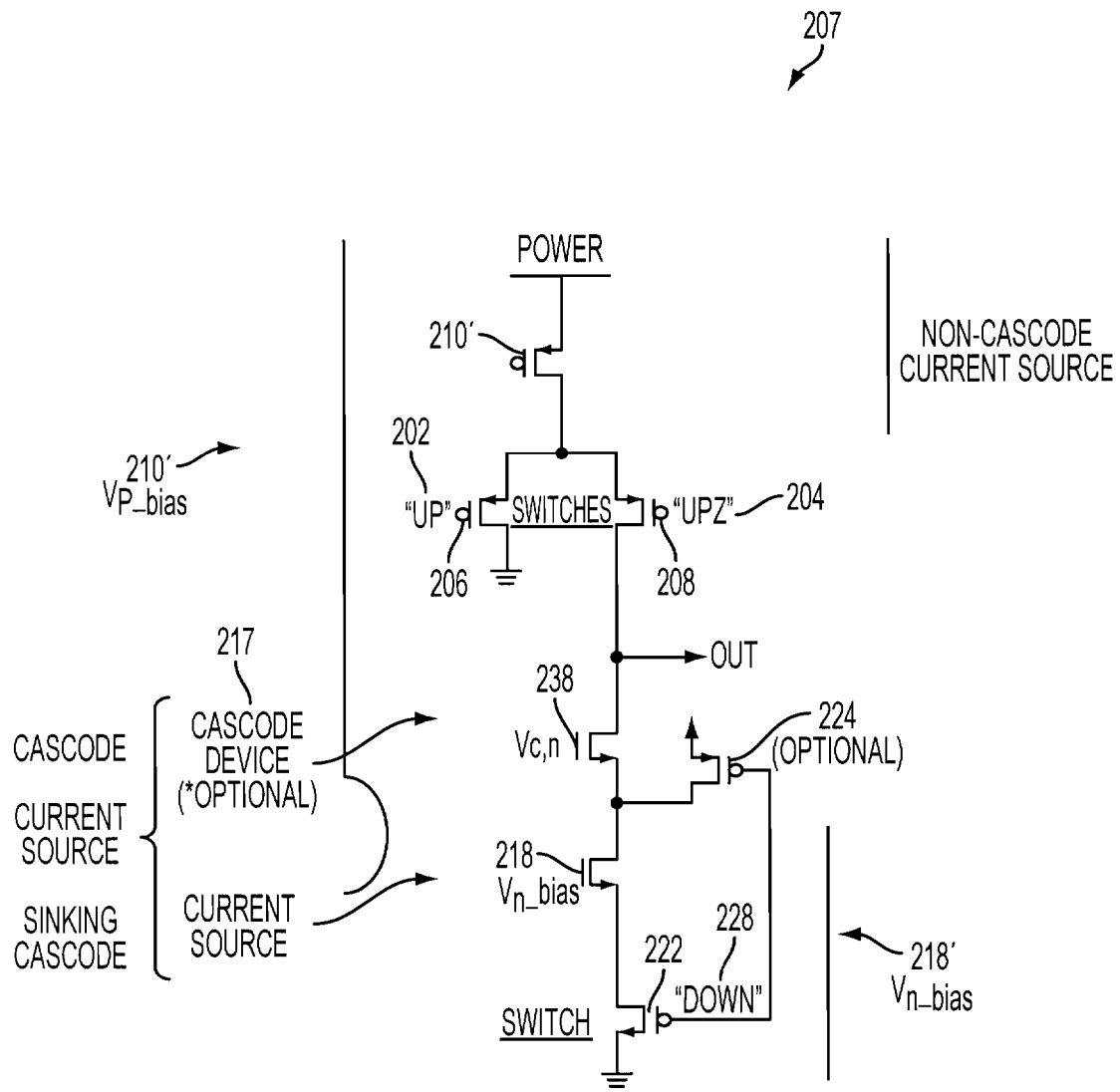
FIG. 10 is a schematic diagram illustrating the alternative design of the sourcing current source which is non-cascode and the sinking current source which is cascode.
Figure 11:
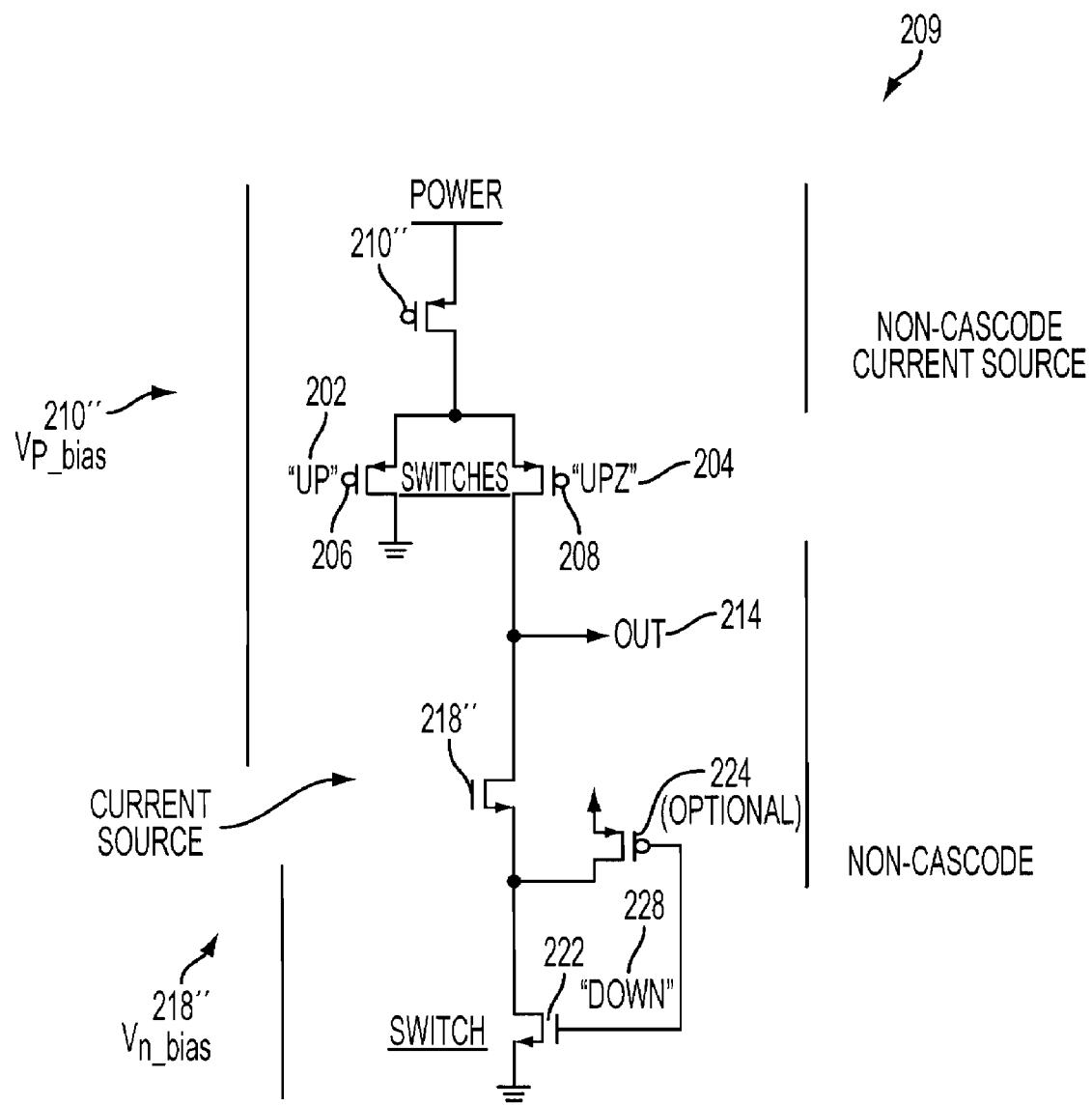
FIG. 11 is a schematic diagram illustrating the alternative design of the sourcing current source which is non-cascode and the sinking current source which is non-cascode.

Although the present invention has been described in accordance with the embodiments shown, one of ordinary skill in the art will readily recognize that there could be a variety of embodiments of the sourcing and sinking circuits and those variations would be within the spirit and scope of the present invention. As is seen above, FIGS. 3-6 show a design 200 wherein the PMOS sourcing current transistor 210 is cascode and the NMOS sinking circuit 218 is non-cascode. FIG. 9 shows an alternative design 205 wherein the PMOS sourcing current transistor 210' is cascode and the NMOS sinking circuit 218' is cascode. FIG. 10 shows the alternative design 207 wherein the PMOS sourcing current transistor 210" is non-cascode and the NMOS sinking circuit 218" is cascode. FIG. 11 shows the alternative design 209 wherein the PMOS sourcing current transistor 210''' is non-cascode and the NMOS sinking circuit 218''' is non-cascode. Therefore, many modifications may be made by one of ordinary skill in the art without departing from the spirit and scope of the appended claims.

What is claimed is:

1. A charge pump for a phase-locked loop circuit, comprising:
   a sourcing current source providing a sourcing current, wherein the sourcing current source is coupled to a high-voltage voltage supply;
   a sourcing differential switch steering the sourcing current direction, wherein the sourcing differential switch is coupled between the sourcing current source and an output of the charge pump;
   a sourcing control circuit using a low-voltage sourcing control signal to selectively source the sourcing current to the output, wherein the sourcing control circuit receives a low-voltage charging-up signal from a phase frequency detector of the phase-locked loop circuit;
   a sinking switch;
   a sinking current source providing a sinking current, wherein the sinking current source is coupled between the output and the sinking switch; and
   a sinking control circuit using a low-voltage sinking control signal to selectively sink the sinking current to ground, wherein the sinking control circuit receives a low-voltage charging-down signal from the phase frequency detector of the phase-locked loop circuit.

2. The charge pump of claim 1, wherein the low-voltage charging up signal and the low-voltage sourcing control signal are at the same voltage level, and the low-voltage charging down signal and the low-voltage sinking control signal are at the same voltage level.

3. The charge pump of claim 1, wherein the phase frequency detector has an operating voltage substantially equal to the low voltage.

4. The charge pump of claim 1 wherein the sourcing differential switch includes a plurality of PMOS transistors used for switching the current flow based on the sourcing control signals, and wherein the sinking switch includes an NMOS transistor used for switching the current flow based on the sinking control signals.

5. The charge pump of claim 1 wherein the sourcing current source includes a PMOS transistor and the sinking current circuit includes an NMOS transistor.

6. The charge pump of claim 1 wherein the low-voltage sourcing control signal includes a sourcing control signal and a complimentary sourcing control signal, and wherein the low-voltage sinking control signal includes a sinking control signal.

7. The charge pump of claim 1 wherein the sourcing current source is cascode and the sinking current source is non-cascode.

8. The charge pump of claim 1 wherein the sourcing current source and the sinking current source are utilized to provide a desired performance of the charge pump.

9. The charge pump of claim 8 wherein the performance of the charge pump can be tuned by turning a portion of the sourcing current sources and sinking current sources off.

10. A phase-locked loop circuit comprising:
   a phase frequency detector operating at a low voltage and providing low-voltage sourcing control signals and low-voltage sinking control signals at the low voltage; and
   a charge pump operating at a high voltage and including a sourcing current source providing a sourcing current, wherein the sourcing current source is coupled to a high-voltage voltage supply;
   a sourcing differential switch steering the sourcing current direction, wherein the sourcing differential switch is coupled between the sourcing current source and an output of the charge pump;
   a sourcing control circuit using a low-voltage sourcing control signal to selectively source the sourcing current to the output;
   a sinking current source providing a sinking current, wherein the sinking current circuit is coupled between the output and a sinking switch; and
   a sinking control circuit using a low-voltage sinking control signal to selectively sink the sinking current to ground.

11. The phase-locked loop circuit of claim 10 wherein the sourcing control circuit receives a low-voltage charging-up signal and the sinking control circuit receives a low-voltage charging-down signal from a phase frequency detector of the phase-locked loop circuit.

12. The phase-locked loop circuit of claim 10 wherein the low-voltage charging up signal and the low-voltage sourcing control signal are at the same voltage level, and the low-voltage charging down signal and the low-voltage sinking control signal are at the same voltage level.

13. The phase-locked loop circuit of claim 10 wherein the phase frequency detector has an operating voltage substantially equal to the low voltage.

14. The phase-locked loop circuit of claim 10 wherein the sourcing differential switch includes a plurality of PMOS transistors used for switching the current flow based on the sourcing control signals, and wherein the sinking switch includes an NMOS transistor used for switching the current flow based on the sinking control signals.

15. The phase-locked loop circuit of claim 10 wherein the sourcing current source includes a PMOS transistor and the sinking current source includes an NMOS transistor.

16. The phase-locked loop circuit of claim 10 wherein the low-voltage sourcing control signal includes a sourcing control signal and a complimentary sourcing control signal, and wherein the low-voltage sinking control signal includes a sinking control signal.

17. The phase-locked loop circuit of claim 10 wherein the sourcing current source is cascode and the sinking current source is non-cascode.

18. The phase-locked loop circuit of claim 10 wherein a plurality of sourcing current sources and sinking current sources are utilized to provide a desired performance of the charge pump.

19. The phase-locked loop circuit of claim 18 wherein the performance of the charge pump can be tuned by turning a portion of the sourcing current sources and sinking current sources off.

\* \* \* \* \*